(12) United States Patent
Choi et al.

(10) Patent No.: US 8,099,620 B2
(45) Date of Patent: Jan. 17, 2012

(54) DOMAIN CROSSING CIRCUIT OF A SEMICONDUCTOR MEMORY APPARATUS

(75) Inventors: Hae Rang Choi, Ichon-si (KR); Yong Ju Kim, Ichon-si (KR); Sung Woo Han, Ichon-si (KR); Hee Woong Song, Ichon-si (KR); Ic Su Oh, Ichon-si (KR); Hyung Soo Kim, Ichon-si (KR); Tae Jin Hwang, Ichon-si (KR); Ji Wang Lee, Ichon-si (KR); Jae Min Jang, Ichon-si (KR); Chang Kun Park, Ichon-si (KR)

(73) Assignee: Hynix Semiconductor Inc. (KR)

( * ) Notice: Subject to any disclaimer, the term of this patent is extended or adjusted under 35 U.S.C. 154(b) by 455 days.

(21) Appl. No.: 12/346,675

(22) Filed: Dec. 30, 2008

(65) Prior Publication Data

US 2010/0064163 A1    Mar. 11, 2010

(30) Foreign Application Priority Data

Sep. 5, 2008   (KR) .................. 10-2008-0087783

(51) Int. Cl.
*G06F 1/00* (2006.01)
*G06F 1/04* (2006.01)
*G06F 12/00* (2006.01)
*H03K 19/00* (2006.01)
*H03L 7/00* (2006.01)
*G11C 8/00* (2006.01)

(52) U.S. Cl. .......... 713/500; 713/400; 326/93; 327/141; 365/233.1; 710/61; 711/104

(58) Field of Classification Search .................. 713/400, 713/500, 600; 326/93; 327/141; 365/233.1; 710/61; 711/104
See application file for complete search history.

(56) References Cited

U.S. PATENT DOCUMENTS 7,340,632 B2   3/2008   Park
7,375,560 B2   5/2008   Lee et al.

FOREIGN PATENT DOCUMENTS

| JP | 06-203553 | 7/1994 |
| JP | 2004-327008 | 11/2004 |
| KR | 1020040107706 A | 12/2004 |
| KR | 100829455 B1 | 5/2008 |

*Primary Examiner* — Stefan Stoynov
(74) *Attorney, Agent, or Firm* — Baker & McKenzie LLP

(57) ABSTRACT

A domain crossing circuit of a semiconductor memory apparatus, the domain crossing circuit comprising first and second count signals generated at substantially a same clock period, and representing predetermined clock differences with reference to an internal clock signal with respect to same bit combination data, and a data processing unit configured to provide output data corresponding to input data based on the second count signal in response to the input data synchronized to an external clock signal.

36 Claims, 8 Drawing Sheets

PRIOR ART

DOMAIN CROSSING CIRCUIT OF A SEMICONDUCTOR MEMORY APPARATUS

CROSS-REFERENCES TO RELATED APPLICATION

The present application claims priority under 35 U.S.C. §119(a) to Korean application number 10-2008-0087783, filed on Sep. 5, 2008, in the Korean Intellectual Property Office, which is incorporated herein by reference in its entirety as if set forth in full.

BACKGROUND

1. Technical Field

The embodiments described herein relate to a semiconductor memory apparatus and more particularly, to a domain crossing circuit of a semiconductor memory apparatus.

2. Related Art

Generally, a synchronous semiconductor memory apparatus operates in synchronization with a clock signal. In this case, command signals or data that have been synchronized with an external clock signal, must be synchronized with an internal clock signal to operate in an internal circuit. In addition, internal clock signals, which have been synchronized with the internal clock signal, must be synchronized with an external clock signal, called "domain crossing" that refers to a domain change between an internal clock domain and an external clock domain.

FIG. 1 is a schematic block diagram of a conventional crossing circuit of a semiconductor memory apparatus. In FIG. 1, the domain crossing circuit includes a first counter 10, a replica 20, a second counter 30, a data input unit 40, a latch unit 50, and a comparator 60.

In FIG. 1, the domain crossing circuit converts a domain of an external clock signal 'CLK_C' into a domain of an internal clock signal 'CLK_B'. Here, instead of the external clock signal 'CLK_C', the internal clock signal 'CLK_B' generated from a DLL circuit unit (not shown) is used as a reference clock signal serving as a reference for the output of an input data signal 'IN', and an output data signal 'OUT' is provided when a predetermined latency is satisfied. Accordingly, the domain crossing circuit constantly maintains arithmetic differences between count bits output from the first and second counters 10 and 20 to realize latency.

For example, the first counter 10 receives an initial value S<0:n> and consecutively counts from the initial value S<0:n> for every rising edge of the internal clock signal 'CLK_A' to output a first count signal 'CNT_A<0:n>' having (n+1) bits. The internal clock signal 'CLK_A' passes through the replica 20 to be the internal clock signal 'CLK_B' delayed by predetermined time. Accordingly, the second counter 30 is triggered by a reset signal 'RESET' for every rising edge of the internal clock signal 'CLK_B' to consecutively count so that a second count signal 'CNT_B<0:n>' having (n+1) bits is output. In this case, the internal clock signal 'CLK_A' and the internal clock signal 'CLK_B' are generated from the DLL circuit unit (not shown). The replica 20 is designed by taking account into delay time such that the phase of the internal clock signal 'CLK_B' is identical to the phase of the external clock signal 'CLK_C'. Here, the replica 20 delays the internal clock signal 'CLK_A' by predetermined time so that the phase of the internal clock signal 'CLK_B' is identical to the phase of the external clock signal 'CLK_C.'

In FIG. 1, the first counter 10 and the second counter 30 count bit signals while maintaining a predetermined clock interval such that the clock interval is equal to latency to be defined later. Here, the first and second counters 10 and 30 are 3-bit counters, wherein the first counter 10 counts from the initial value S<0:n>. For example, if the initial value S<0:n> is '100', then the first counter 10 consecutively counts from '100'. Meanwhile, the second counter 20 always counts from '000' after the reset signal 'RESET' is received. Accordingly, arithmetic differences in output bits of the two counters 10 and 30 are constantly maintained after the reset signal 'RESET' is activated, so that the latency of a semiconductor memory apparatus can be realized. In this case, the initial value S<0:n> of the first counter 10 may have various values according to latency required in the semiconductor memory apparatus.

The data input unit 40 receives an input data signal 'IN' to output a latch signal 'LATCH' in synchronization with the external clock signal 'CLK_C'. In addition, the latch unit 50 triggers and latches the second count signal 'CNT_B<0:n>' at a rising edge of the latch signal 'LATCH'. Such an operation of the latch unit 50 can be performed using a D flip-flop triggered at a rising edge of a signal. Accordingly, when a comparative enable signal 'CMP_EN' is activated, the comparator 60 compares a latch count signal 'LATCH_B<0:n>' having been latched in the latch unit 50 with the first count signal 'CNT_A<0:n>'. If the latch count signal 'LATCH_B<0:n>' is equal to the first count signal 'CNT_A<0:n>', then the output data signal 'OUT' having a high level is applied.

For example, the latch count signal 'LATCH_B<0:n>' is triggered at the rising edge of the latch signal 'LATCH' and continuously latched without change, and the first count signal 'CNT_A<0:n>' is continuously counted. Accordingly, timing, in which the latch count signal 'LATCH_B<0:n>' is equal to the first count signal 'CNT_A<0:n>,' corresponds to latency information required in the semiconductor memory apparatus. Thus, the output data signal 'OUT' can be provided after predetermined latency from the input data signal 'IN'.

In this case, the replica 20 is a chain of a plurality of inverters connected to each other in series. Accordingly, if an abnormal pulse occurs in the internal clock signal 'CLK_A' then the first counter 10 performs a count operation in response to an instantaneous pulse. However, if the internal clock signal 'CLK_A' having the abnormal pulse is applied to the replica 20, an RC component of the inverter chain serves as a low pass filter (LPF) to reduce the noise of voltage. Accordingly, the second counter 20 does not detect the abnormal signal.

The first counter 10 and the second counter 20 perform a count operation adjustably for desired latency while maintaining the same clock interval as described above. However, difference corresponding to one clock interval 1tCLK is made in the count number of the first and second counters 10 and 20 due to the application of the abnormal pulse signal. Accordingly, even if latch and comparative operations are performed thereafter, differences from the desired latency may occur.

SUMMARY

A domain crossing circuit of a semiconductor memory apparatus capable of constantly maintaining latency even if an abnormal internal clock pulse is applied is described herein.

In one aspect, A domain crossing circuit of a semiconductor memory apparatus, the domain crossing circuit comprises first and second count signals generated at substantially a same clock period, and representing predetermined clock differences with reference to an internal clock signal with respect to same bit combination data, and a data processing unit configured to provide output data corresponding to input data based on the second count signal in response to the input data synchronized to an external clock signal.

In another aspect, a domain crossing circuit of a semiconductor memory apparatus, the domain crossing circuit comprises a controller configured to receive input data synchronized with an external clock signal to latch a second count signal, which is comparison data; and a comparator configured to provide an output data synchronized with the internal clock signal according to a comparison result of an output signal of the controller and a first count signal In another aspect, a domain crossing circuit of a semiconductor memory apparatus, the domain crossing circuit comprises a comparative signal providing unit configured to provide first and second count signals by using an output signal of a counter driven by receiving an internal clock signal; and a data processing unit configured to receive input data synchronized to an external clock signal to compare the first count signal with the second count signal and provide output data at timing when the first count signal is substantially identical to the second count signal, wherein the second count signal is provided by performing an addition operation using a least significant bit of the first count signal.

In another aspect, a domain crossing circuit of a semiconductor memory apparatus, the domain crossing circuit comprises a comparative signal providing unit configured to provide a first count signal and a second count signal in response to an internal clock signal, the first count signal being a source signal for an internal clock signal domain, the second count signal being a target signal for the internal clock domain and provided by performing an addition operation using a least significant bit of the first count signal; and a data processing unit configured to provide output data obtained by converting input data for an external clock domain received based on an external clock signal into a signal for the internal clock domain by using the first and second count signals, wherein the output data are output based on output timing of the second count signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 2:
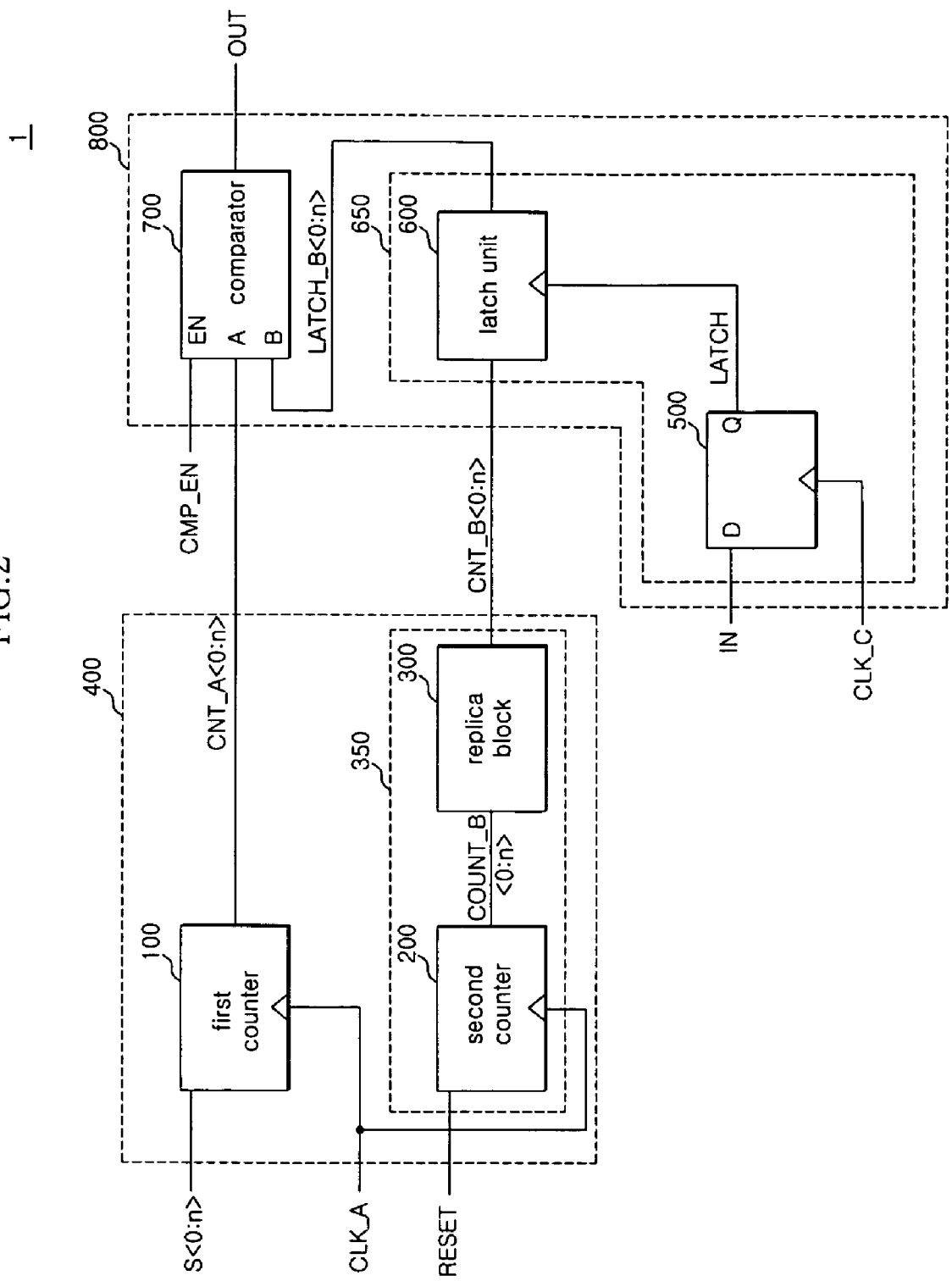
FIG. 2 is a schematic block diagram of an exemplary domain crossing circuit of a semiconductor memory apparatus according to one embodiment.
Figure 3:
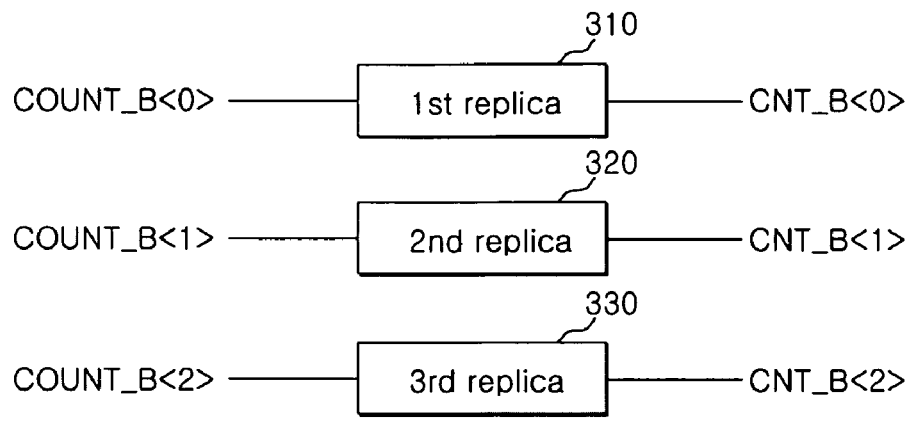
FIG. 3 is a schematic block diagram of an exemplary replica block capable of being implemented in the circuit of FIG. 2 according to one embodiment.

FIG. 2 is a schematic block diagram of an exemplary domain crossing circuit 1 of a semiconductor memory apparatus according to one embodiment, and FIG. 3 is a schematic block diagram of an exemplary replica block 300 capable of being implemented in the circuit 1 of FIG. 2 according to one embodiment.

In FIG. 2, the domain crossing circuit 1 can be configured to include a first comparative signal providing unit 400 and a data processing unit 800. The first comparative signal providing unit 400 can include a first counter 100 that is a source counter and a target counter block 350. In addition, the data processing unit 800 can be configured to include a data input unit 500, a latch unit 600, and a comparator 700.

In FIG. 2, the domain crossing circuit 1 can employ an internal clock signal 'CLK_A' which can be substantially the same source clock signal for the first counter 100 and a second counter 200, so that the first and second counters 100 and 200 can simultaneously respond to the variation of the internal clock signal 'CLK_A'. For example, the first counter 10 can receive an initial value S<0:n>, and can consecutively count from the initial value S<0:n> for every rising edge of the internal clock signal 'CLK_A' to output a first count signal 'CNT_A<0:n>' having (n+1) bits. Here, the first counter 100 can operate in response to the internal clock signal 'CLK_A' that is a reference source clock signal to synchronize an external clock signal 'CLK_C'.

The target counter block 350 can be configured to include the second counter block 200 and the replica block 300. If receiving a reset signal 'RESET', the second counter 200 can be triggered for every rising edge of the internal clock signal 'CLK_A' to consecutively perform a count operation so that a temporary count signal 'COUNT_B<0:n>' having (n+1) bits can be output. Accordingly, the second counter 200 can perform a count operation in response to the internal clock signal 'CLK_A' that is the same clock signal as that of the first counter 100, thereby providing the temporary count signal 'COUNT_B<0:n>' having substantially the same interval as that of the first count signal 'CNT_A<0:n>'. However, the first counter 100 can have a counting initial value different from that of the second counter 200. For example, the first counter 100 can start a count operation from the preset initial value S<0:n>, and the second counter 200 can always start a count operation from '000'. Here, the first and second counters 100 and 200 can count the same number of bits.

The first and second counters 100 and 200 can employ the same clock signal, i.e., the internal clock signal 'CLK_A'. Accordingly, even if the internal clock signal 'CLK_A' instantaneously has an abnormal pulse, the first and second counters 100 and 200 can perform a count operation in response to the abnormal pulse of the internal clock signal 'CLK_A'. For example, both the first and second counters 100 and 200 can reflect any variations of the internal clock signal 'CLK_A' so that constant clock signal difference is made in output signals of the two counters 100 and 200.

In FIG. 2, the internal clock signal 'CLK_A' can be generated from a DLL circuit unit (not shown). Accordingly, a phase of an internal target signal subjected to domain crossing must be corrected such that the phase of the internal target signal is identical to a phase of the external clock signal 'CLK_C'. For example, predetermined delay time differences between the internal clock signal 'CLK_A' and the external clock signal 'CLK_C' must be compensated.

FIG. 3 is a schematic block diagram of an exemplary replica block 300 capable of being implemented in the circuit of FIG. 2 according to one embodiment. In FIG. 3, the replica block 300 can receive the temporary count signal 'COUNT_B<0:n>', can delay the temporary count signal 'COUNT_B<0:n>' by predetermined time, and can output a second count signal 'CNT_B<0:n>'. For example, the replica block 300 can provide the second count signal 'CNT_B<0:n>' delayed from the temporary count signal 'COUNT_B<0:n>' by predetermined time such that the predetermined delay time difference between the external clock signal 'CLK_C' and the internal clock signal 'CLK_A' generated from the DLL circuit unit (not shown) can be compensated. Since the replica block 300 must individually correspond to each bit of the temporary count signal 'COUNT_B<0:n>', the number of replicas of the replica block 300 corresponds to the number of bits of the temporary count signal 'COUNT_B<0:n>'.

For example, the replica block 300 includes first to third replicas 310 to 330 corresponding to a 3-bit temporary count signal 'COUNT_B<0:2>'. Accordingly, the first replica 310 provides a first count bit CNT_B<0> of the second count signal 'CNT<0:2>' by delaying a first count bit COUNT_B<0> of the temporary count signal 'COUNT_B<0:2>' by predetermined time such that the phase of the first temporary count bit COUNT_B<0> is identical to the phase of the external clock signal 'CLK_C'. Since the second and third replicas 320 and 330 can perform substantially the same operation as that of the first replica 310, details of the second and third replicas 320 and 330 will be omitted in order to avoid redundancy.

In FIG. 2, a controller 650 can include the data input unit 500 and the latch unit 600. When receiving an input data signal 'IN' in synchronization with the external clock signal 'CLK_C' the controller 650 can latch an output signal of the target counter block 350. In addition, the data input unit 500 can provide the input data signal 'IN' as a latch signal 'LATCH' in synchronization with a rising edge of the external clock signal 'CLK_C'. Here, the input data signal 'IN' is represented as input data for the purpose of explanation. However, when a signal requires latency between a data input time point and a data output time point, the signal may serve as the input data signal 'IN'. For example, an output enable signal may be employed as the input data signal IN. Such an input data signal 'IN' can be a control signal to control the comparator 700.

In addition, the input data signal 'IN' can relate to the generation of a comparative enable signal 'CMP_EN' to control the comparator 700. Accordingly, in order to output latency information, a comparative operation can be performed from a time point at which the input data signal 'IN' is activated at a high level. For example, the data input unit 500 can include a D flip-flop.

The latch unit 600 can trigger and latch the second count signal 'CNT_B<0:n>' at a rising edge of the latch signal 'LATCH'. For example, the latch unit 600 can trigger the second count signal 'CNT_B<0:n>' received at timing to activate the latch signal 'LATCH' to output a latch count signal 'LATCH_B<0:n>'. The latch count signal 'LATCH_B<0:n>' can refer to predetermined data to be compared. For example, the latch unit 600 can be realized by using a D flip-flop triggered at a rising edge.

If the comparative enable signal 'CMP_EN' is activated, then the comparator 700 can compare the latch count signal 'LATCH_B<0:n>' having been latched in the latch unit 600 with the first count signal 'CNT_A<0:n>' continuously counted. If the latch count signal 'LATCH_B<0:n>' is equal to the first count signal 'CNT_A<0:n>', then the comparator 700 can provide an output data signal 'OUT' having a high level. The comparative enable signal 'CMP_EN' can be triggered and activated at a rising edge of the latch signal 'LATCH'. Accordingly, the comparative enable signal 'CMP_EN' can be triggered and deactivated at a falling edge of the output data signal 'OUT'. Thus, the comparator 700 can continuously compare the latch count signal 'LATCH_B<0:n>' having no change with the changed first count signal 'CNT_A<0:n>' while the comparative enable signal 'CMP_EN' is being activated. If the latch count signal 'LATCH_B<0:n>' is equal to the first count signal 'CNT_A<0:n>', then the comparator 700 can provide the output data signal 'OUT'.

As described above, the first and second counters 100 and 200 can operate while maintaining constant clock differences there between with respect to the same bit combination. The clock differences can be equal to predetermined latency. For example, since the latch count signal 'LATCH_B<0:n>' can be generated based on the input data signal 'IN', latency between the input data signal 'IN' and the output data signal 'OUT' can be determined based on timing in which the latch count signal 'LATCH_B<0:n>' is equal to the first count signal 'CNT_A<0:n>'. An output signal of the second counter 200 can pass through the replica block 300 to compensate for difference in delay time between the internal clock signal 'CLK_A' and the external clock signal 'CLK_C'. Thus, even if an abnormal pulse signal occurs, the domain crossing circuit 1 can drive the first and second counters in synchronization with the internal clock signal 'CLK_A' that is a source clock signal to maintain constant clock difference with respect to the same bit combination. Accordingly, the above latency satisfies latency required in the semiconductor memory, and the output data signal 'OUT' can be provided after predetermined latency from the input data 'IN'.

Figure 4:
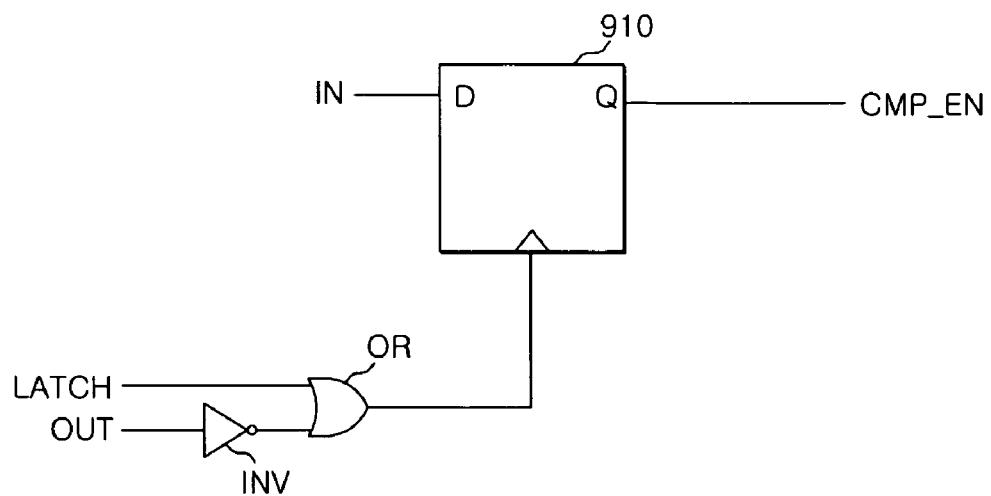
FIG. 4 is a schematic circuit of an exemplary comparative enable signal generator capable of being implemented in the circuit of FIG. 2 according to one embodiment.
Figure 9:
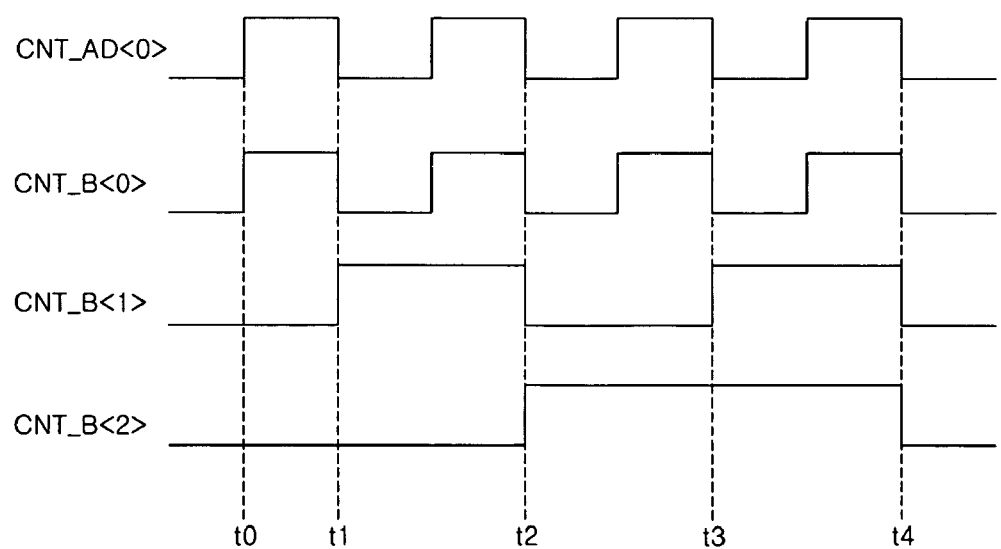
FIG. 9 is a timing chart demonstrating operational waveforms of the device of FIG. 8 according to one embodiment.

FIG. 4 is a schematic circuit of an exemplary comparative enable signal generator 900 capable of being implemented in the circuit of FIG. 2 according to one embodiment. In FIG. 9, the comparative enable signal generator 900 can be configured to include an inverter INV, an OR gate OR, and a latch unit 910.

The inverter INV can invert the output data signal 'OUT' to provide an inverted signal to the OR gate OR. In addition, the OR gate OR can perform an OR operation with respect to the latch signal 'LATCH' and the output signal of the inverter 'INV'.

The latch unit 910 can be a D flip-flop, for example. Accordingly, the latch unit 910 can latch the input data signal 'IN' in response to a high level of the output signal of the inverter INV and the latch signal 'LATCH'. For example, the latch unit 910 can latch the input data signal 'IN' triggered and activated at a rising edge of the latch signal 'LATCH'. Then, the latch 910 can latch the input data signal 'IN' triggered and deactivated at an inverted level, i.e., a falling edge of the output data signal 'OUT' activated at timing in which the first count signal 'CNT_A<0:n>' has substantially the same phase as that of the second count signal 'CNT_B<0:n>'.

The comparative enable signal generator 900 can provide the comparative enable signal 'CMP_EN' that is triggered and activated at the rising edge of the latch signal 'LATCH', and can then trigger and deactivate at the falling edge of the output data signal 'OUT'. As described above, the comparative enable signal generator 900 can start a comparative operation of the comparator 800 (in FIG. 2) using the latch signal 'LATCH' responding to the input data signal 'IN' only when the input data signal 'IN' is generated. In addition, since the comparative enable signal generator 900 can be deactivated using the output data signal 'OUT', the comparative operation of the comparator 800 (in FIG. 2) can be terminated by the output data signal 'OUT'. Accordingly, the comparative operation of the comparator 800 (in FIG. 2) can be performed only when the comparative operation is required, so that power consumption can be reduced.

Figure 1:
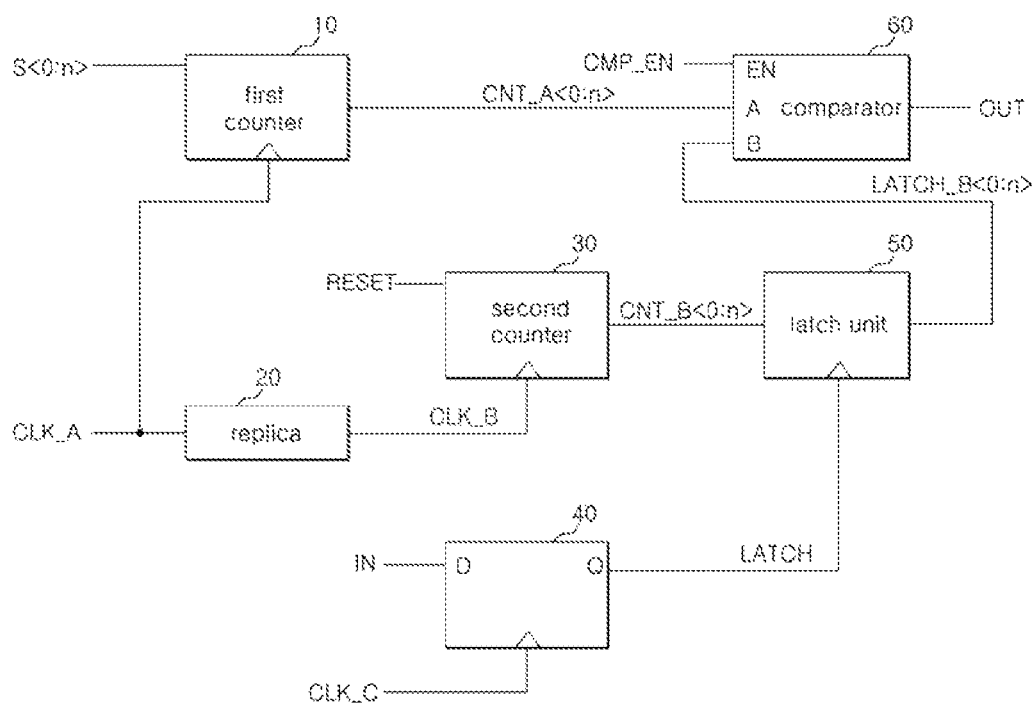
FIG. 1 is a schematic block diagram of a conventional crossing circuit of a semiconductor memory apparatus.
Figure 5:
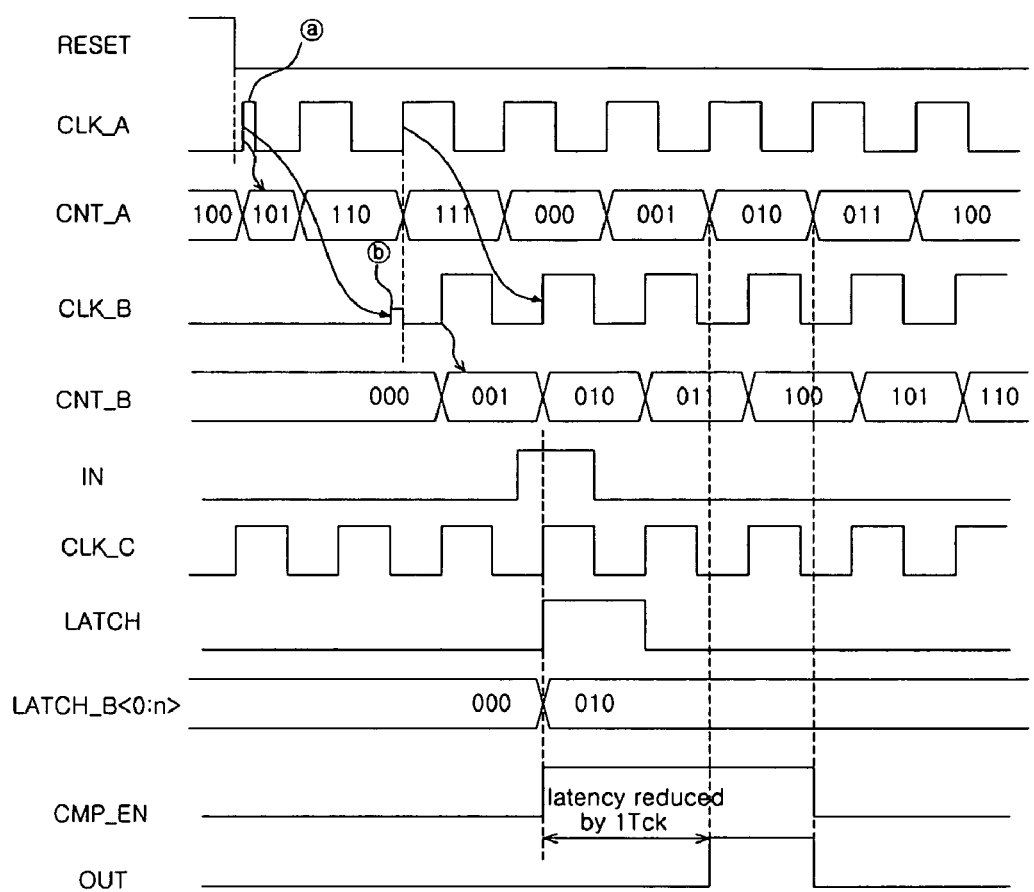
FIG. 5 is a timing chart demonstrating operational waveforms of a conventional domain crossing circuit.

FIG. 5 is a timing chart demonstrating operational waveforms of a conventional domain crossing circuit. In FIG. 5, and hereinafter, details of the first counter 10 having an initial value S<0:n> set to '100' to satisfy latency 2 (2tCK) will be made with reference to FIGS. 1 and 5. Accordingly, the first counter 10 can count from '100'. Then, even if an abnormal pulse ⓐ occurs in the internal clock signal 'CLK_A' the first counter 10 can respond to the abnormal pulse ⓐ to perform a next count operation.

However, the internal clock signal 'CLK_B' is generated by delaying the internal clock signal 'CLK_A', which is a source clock signal, through the replica 20, and the abnormal pulse ⓐ can be attenuated by the replica 20. Even though the second counter 30 can count from '000', the second counter 30 does not respond to the attenuated abnormal pulse having a low voltage level. Accordingly, one clock period difference, i.e., 1tck, can be made between the count operation of the first counter 10 and the count operation of the second counter 30.

Accordingly, an output bit signal '010' of the second counter 30 can be latched by the input data signal 'IN', and compared with an output bit of the first counter 10. The output data signal 'OUT' can be output at a timing when the output bit signal of the second counter 30 is substantially identical to the output bit signal of the first counter 10. Accordingly, since an error occurs in the count number of the clock signal, a bit combination signal of the second counter 30 latched by the latch signal 'LATCH' can advance by one clock period from the output of the first counter 10 with respect to the data having the same bit combination. In addition, since the output data signal 'OUT' can be provided at a timing when the bit combination, i.e., "010", of the first count signal 'CNT_A<0:n>' is equal to the erroneous bit signal of "010", 1tCK(A), which is insufficient by 1tCK from desired latency, can be realized. Thus, since latency A different from latency required for the output data signal A can be provided to an internal circuit (not shown), erroneous operations can occur.

Figure 6:
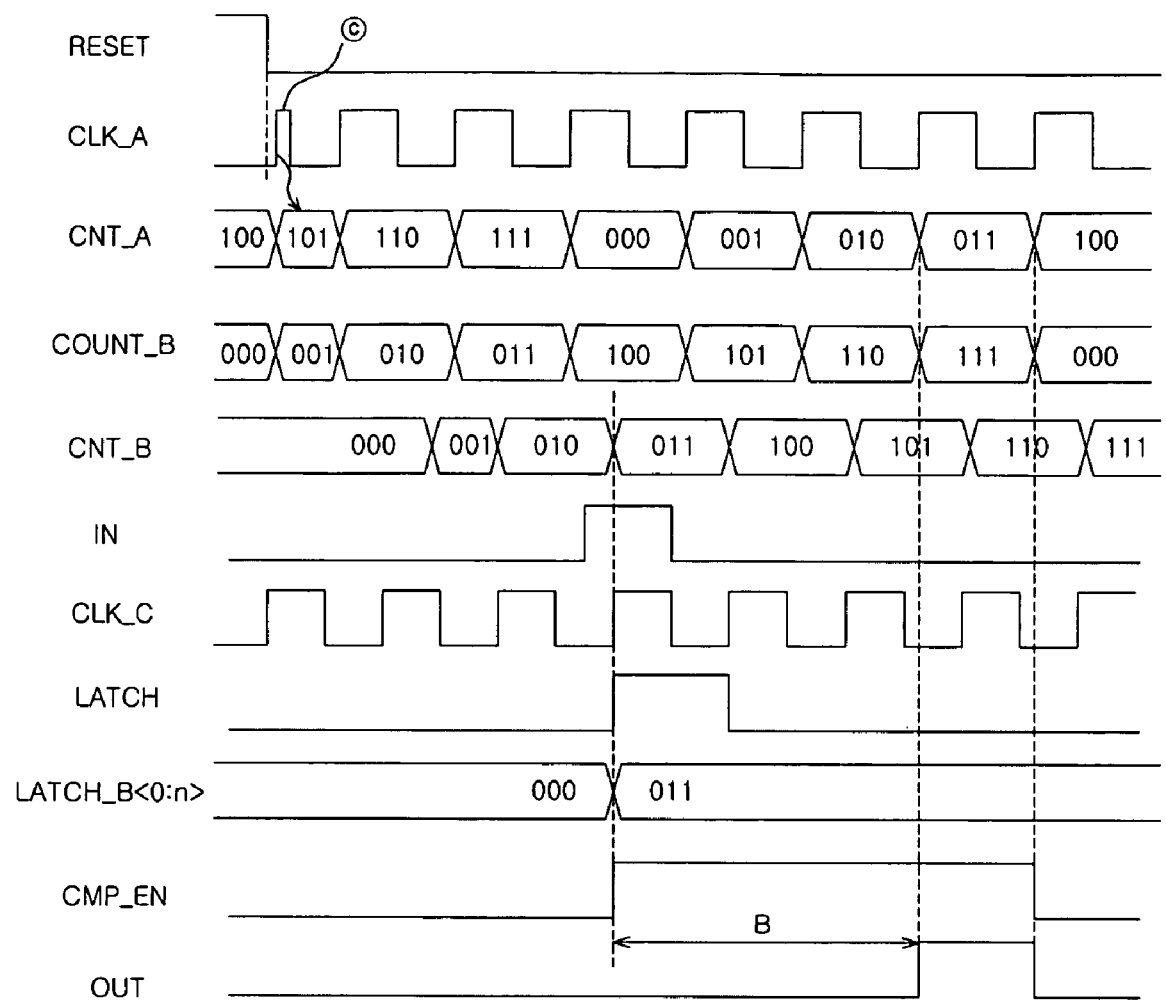
FIG. 6 is a timing chart demonstrating operational waveforms of an exemplary domain crossing circuit according one embodiment.

FIG. 6 is a timing chart demonstrating operational waveforms of an exemplary domain crossing circuit according to one embodiment;

Referring to FIGS. 2, 3, 4, and 6, for the purpose of explanation, the initial value S<0:n> of the first counter 100 is provided as "100" in order to satisfy latency 2 (2tCK). Accordingly, the first counter 100 can count from "100". Then, when an abnormal pulse ⓒ occurs in the internal clock signal 'CLK_A' the first counter 100 can respond to the abnormal pulse ⓒ to consecutively perform a next count operation. Since the second counter 200 can operate in response to the internal clock signal 'CLK_A' the second counter 200 can perform a count operation in response to the abnormal pulse ⓒ. Here, the phase of the first count signal 'CNT_A<0:n>' can be substantially identical to the phase of the of the temporary count signal 'COUNT_B<0:n>'. In addition, the first count signal 'CNT_A<0:n>' can be generated with substantially the same period as that of the temporary count signal 'COUNT_B<0:n>'. Even though the first and second counters 100 and 200 respond to the abnormal pulse ⓒ, the first and second counters 100 and 200 can perform a count operation in response to a normal pulse thereafter. Accordingly, difference of output bits of the first and second counters 100 and 200 can be made while maintaining substantially the same clock interval. Thus, even if an abnormal pulse occurs, difference between output bits of the two first and second counters 100 and 200 can be uniformly maintained with substantially the same clock interval, so that latency can be uniformly maintained.

Subsequently, since each bit of the temporary count signal 'COUNT_B<0:n>' passes through the replica block 300, the temporary count signal 'COUNT_B<0:n>' can be adjusted to be synchronized with the phase of the external clock signal 'CLK_C' and can be provided as the second count signal 'CNT_B<0:n>'.

Then, the latch signal 'LATCH' can be generated from the input data signal 'IN', and "011", which is the output bit signal of the second counter 200, can be latched in response to the latch signal 'LATCH'. After the latched "011" is stored as the latch count signal 'LATCH_B<0:n>', the latch count signal 'LATCH_B<0:n>' and the output bit signal of the first counter 100 can be compared with each other until the output signal of the first counter 100 becomes "011". For example, when it is determined by the comparator 700 that the output bit signal of the first counter 100 is substantially equal to the latch count signal 'LATCH_B<0:n>', i.e., after 2tCK(B) has lapsed from the input of the input data signal 'IN', the output data signal 'OUT' can be output so that desired latency can be satisfied.

Figure 7:
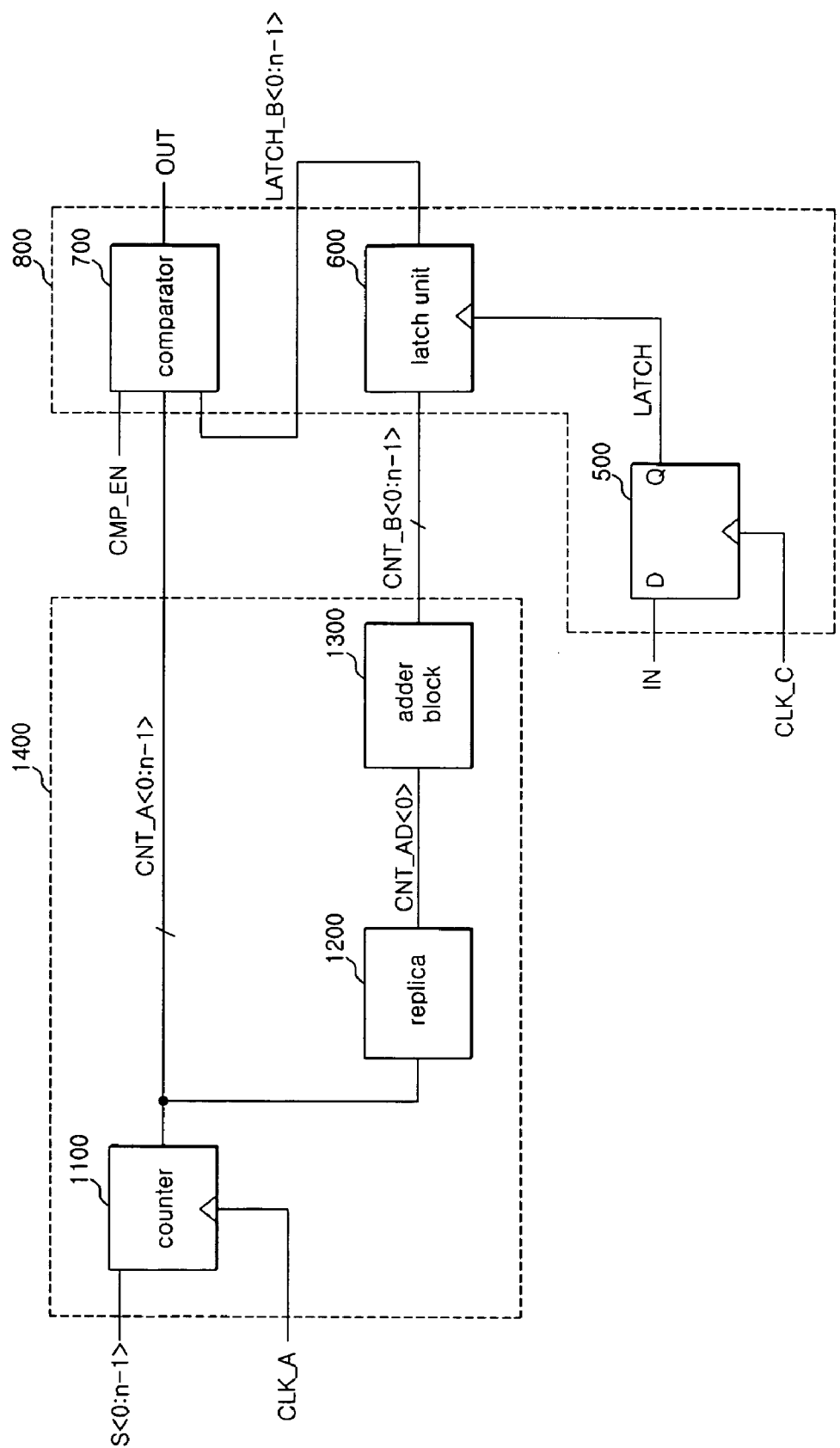
FIG. 7 is a schematic block diagram of another exemplary domain crossing circuit of a semiconductor memory apparatus according to another embodiment.

FIG. 7 is a schematic block diagram of another exemplary domain crossing circuit 2 of a semiconductor memory apparatus according to another embodiment. In FIG. 7, the domain crossing circuit 2 can convert a reference clock signal for output of a input data signal 'IN' into a domain for an internal clock signal 'CLK_A' which can be generated from a DLL circuit unit (not shown), instead of an external clock signal 'CLK_C'. When predetermined latency is satisfied, the output data signal 'OUT' can be provided.

In FIG. 7, the domain crossing circuit 2 can be configured to include a second comparative signal providing unit 1400 and a data processing unit 800. The second comparative signal providing unit 1400 can include a counter 1100, a replica 1200, and an adder block 1300. In addition, the data processing unit 800 can includes a data input unit 500, a latch unit 600, and a comparator 700.

The counter 1100 can receive an initial value S<0:n−1>, can consecutively count from the initial value S<0:n−1> for every rising edge of the internal clock signal 'CLK_A', and can output a first count signal 'CNT_A<0:n−1>' having n bits. For example, on the assumption that bit combination of the initial value S<0:n−1> is "100", the counter 1100 can consecutively count from "100" by one bit. Here, the first count signal 'CNT_A<0:n−1>' can become a source count signal which is a comparison target. Alternatively, a target count bit, which is a comparison target, can be generated by using the least significant bit of the first count signal 'CNT_A<0:n−1>', which can be an output signal of the counter 1100, instead of the internal clock signal 'CLK_A'.

The internal clock signal 'CLK_A' can be generated from a DLL circuit unit (not shown). Accordingly, a phase of an internal target signal having subject to domain crossing must be corrected such that the phase of the internal target signal is substantially identical to a phase of the external clock signal 'CLK_C'. For example, predetermined delay time differences between the internal clock signal 'CLK_A' and the external clock signal 'CLK_C' must be compensated. Accordingly, output timing of final output data must be timing based on the delay time and latency. Thus, the replica 1200 can receive the least significant bit CNT_A<0> of the first count signal 'CNT_A<0:n−1>', can delay the least significant bit CNT_A<0> by predetermined time, and can provide the delayed least significant bit CNT_AD<0>.

The adder block 1300 can perform a one-bit addition operation by using the delayed least significant bit CNT_AD<0> instead of the internal clock signal 'CLK_A'. For example, the delayed least significant bit CNT_AD<0> can be provided as the least significant bit CNT_B<0> of the second count signal 'CNT_B<0:2>'. Here, the second bit CNT_B<1> of the second count signal 'CNT_B<0:n−1>' can be provided for every transition period of the delayed least significant bit CNT_AD<0>. In addition, the most significant bit CNT_B<2> may be provided for every transition period of the second bit CNT_B<1>.

In FIG. 7, the counter 1100 and the adder block 1300 can provide bit signals while maintaining a predetermined clock interval such that the clock interval can be equal to latency to be defined later. For example, on the assumption that the counter 1100 is a 3-bit counter and has the initial value S<0:n> of "100", the counter 1100 can sequentially count from "100". In addition, the adder block 1300 can add one bit to the least significant bit CNT_A<0> of the first count signal 'CNT_A<0:n−1>', and can add one bit to the result bit such that the higher bit can be changed. For example, the adder block 1300 can add one bit to "000", which is an output signal of the second count signal 'CNT_B<0:n−1>', without an additional reset signal or an additional clock signal. Accordingly, arithmetic differences of output bits of the counter 1100 and the adder block 1300 can be constantly maintained, so that latency of the semiconductor memory apparatus can be realized. Here, the initial value S<0:n> of the counter 1100 can be varied according to latency required in the semiconductor memory.

The counter 1100 can perform a count operation in response to an instantaneous abnormal pulse of the internal clock signal 'CLK_A', and the adder block 11300 can perform an addition operation by using an output signal of the count operation. Accordingly, the variations of the internal clock signal 'CLK_A' can be reflected on both the counter 1100 and the adder block 1300. Thus, the output signals of the counter 1100 and the adder block 1300 can maintain constant clock difference.

When receiving the input data signal 'IN' in synchronization with the external clock signal 'CLK_C', the data processing unit 800 can compare output signals of the second comparative signal providing unit 1400 with each other to provide the output data signal 'OUT'.

The data input unit 500 can provide the input data signal 'IN' as the latch signal 'LATCH' in synchronization with a rising edge of the external clock signal 'CLK_C'. Here, the input data signal 'IN' is represented as input data for the purpose of explanation. However, if a signal requires latency between a data input time point and a data output time point, the signal may serve as the input data signal 'IN'. For example, an output enable signal may be employed as the input data signal 'IN'. Such an input data signal 'IN' can be a control signal for the comparator 700, and the data input unit 500 can be a D flip-flop.

In FIG. 7, the latch unit 600 can trigger and latch the second count signal 'CNT_B<0:n−1>' at a rising edge of the latch signal 'LATCH'. For example, the latch unit 600 can trigger the second count signal 'CNT_B<0:n−1>' received at timing to activate the latch signal 'LATCH' to output a latch count signal 'LATCH_B<0:n−1>'. Here, the latch count signal 'LATCH_B<0:n−1>' can refer to predetermined data to be compared. In addition, the latch unit 600 can be realized by using a D flip-flop triggered at a rising edge of a clock signal.

If the comparative enable signal 'CMP_EN' is activated, then the comparator 700 can compare the latch count signal 'LATCH_B<0:n−1>' having been latched in the latch unit 600 with the first count signal 'CNT_A<0:n−1>' continuously counted. If the latch count signal 'LATCH_B<0:n−1>' is substantially equal to the first count signal 'CNT_A<0:n−1>', then the comparator 700 can provide the output data signal 'OUT' having a high level.

The comparative enable signal 'CMP_EN' can be triggered and activated at a rising edge of the latch signal 'LATCH'. Then, the comparative enable signal 'CMP_EN' can be triggered and deactivated at a falling edge of the output data signal 'OUT'. Accordingly, the comparator 700 can continuously compare the latch count signal 'LATCH_B<0:n−1>' having no change with the changed first count signal 'CNT_A<0:n−1>' while the comparative enable signal 'CMP_EN' is being activated. If the latch count signal 'LATCH_B<0:n−1>' is substantially equal to the first count signal 'CNT_A<0:n−1>', then the comparator 700 can provide the output data signal 'OUT'.

As described above, the counter 1100 and the adder block 1300 can operate while maintaining constant clock differences with reference to the same bit combination. The clock differences can be identical to predetermined latency. For example, since the latch count signal 'LATCH_B<0:n−1>' can be generated based on the input data signal 'IN', latency between the input data signal 'IN' and the output data signal 'OUT' can be determined based on timing in which the latch count signal 'LATCH_B<0:n—1>' is substantially equal to the first count signal 'CNT_A<0:n−1>'. Here, an output signal of the counter 1100 can pass through the replica block 300 to compensate for the delay time differences between the internal clock signal 'CLK_A' and the external clock signal 'CLK_C'.

Thus, even if an abnormal pulse signal occurs in the domain crossing circuit, the counter 100 can perform a count operation by reflecting the occurrence of the abnormal pulse signal, and the adder block 300 can perform an addition operation by using an output of the counter 100. Accordingly, the counter 100 and the adder block 300 can maintain constant clock differences there between with respect to the same bit combination. Thus, a latency condition required in the semiconductor memory apparatus can be satisfied, and the output data signal 'OUT' can be provided after predetermined latency from the input data signal 'IN'.

As described above, in the domain crossing circuit, a one-bit addition operation can be performed using the least significant bit of the counter 100. Accordingly, the output bit of the counter 100 and a result of the addition operation can maintain constant arithmetic difference with respect to the same clock signal, thereby realizing latency.

Figure 8:
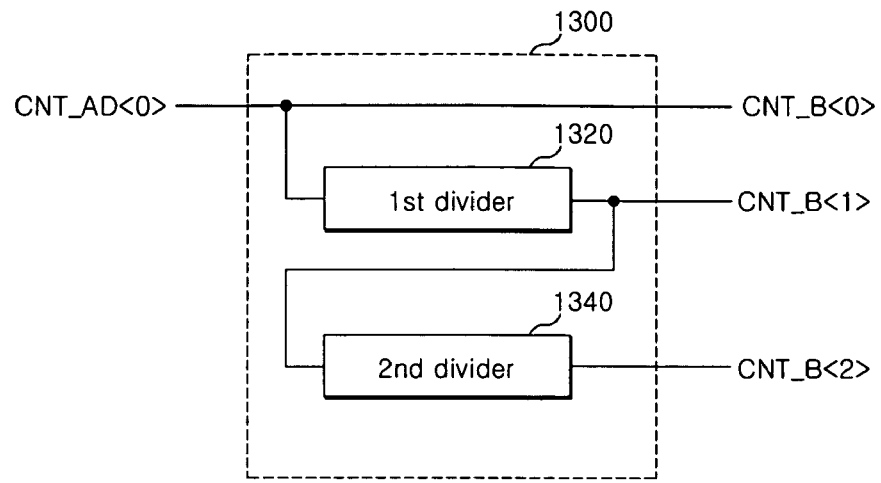
FIG. 8 is a schematic block diagram of an exemplary adder block device capable of being implemented in the circuit of FIG. 7 according to one embodiment.

FIG. 8 is a schematic block diagram of an exemplary adder block device 1300 capable of being implemented in the circuit of FIG. 7 according to one embodiment. In FIG. 8, the adder block device 1300 can include first and second dividers 1320 and 1340, wherein the first and second dividers 1320 and 1340 can include 2N dividers. Accordingly, the delayed least significant bit CNT_AD<0> can be provided as the least significant bit CTN_B<0> of the second count signal 'CNT_B<0:2>'.

The first divider 1320 can receive the delayed least significant bit CNT_AD<0> to provide a signal, which can be 2N-divided. For example, the first divider 320 can provide the second bit CTN_B<1> of the second count signal CNT_B<0:2>. Similarly, the second divider 1340 can receive the second bit CTN_B<1> of the second count signal 'CNT_B<0:2>' to provide a signal, which can be 2N-divided, i.e., the most significant bit CTN_B<2> of the second count signal 'CNT_B<0:2>'.

Although the divider is employed as an example, the adder block 1300 may be realized by using logic gates. For example, a circuit capable of determining the higher bit position by performing one-bit addition can be implemented without using a clock signal and a reset signal.

FIG. 9 is a timing chart demonstrating operational waveforms of the device of FIG. 8 according to one embodiment. It can be understood from FIG. 9 that the least significant bit CNT_B<0> to the most significant bit CNT_B<2> of the second count signal 'CNT_B<0:2>' can be sequentially divided with twice period thereof. Hereinafter, characteristics of the timing chart of the adder block 1300 will be briefly described.

In FIG. 9, the level of the second bit CNT_B<1> of the second count signal 'CNT_B<0:2>' can be inverted at a falling edge of the least significant bit CNT_B<0> of the second count signal 'CNT_B<0:2>'. Similarly, the level of the most significant bit CNT_B<2> of the second count signal 'CNT_B<0:2>' can be inverted at a falling edge of the second bit CNT_B<1> of the second count signal 'CNT_B<0:2>'. As described above, the adder block 300 can determine the higher bit position by performing one-bit addition without a clock signal and a reset signal, thereby providing the second count signal 'CNT_B<0:2>'.

Figure 10:
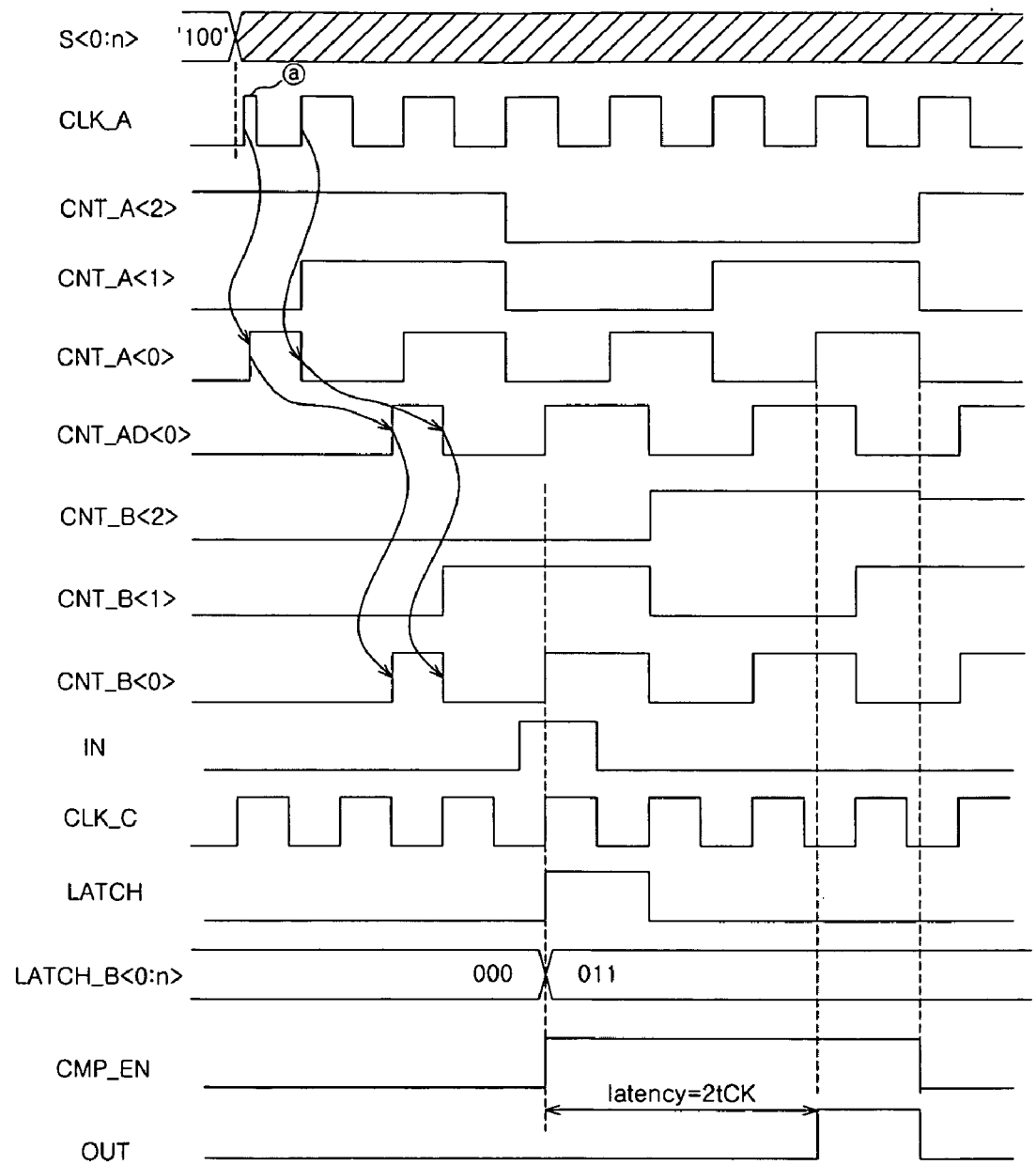
FIG. 10 is a timing chart demonstrating operational characteristics of the circuit of FIG. 7 according to one embodiment.

FIG. 10 is a timing chart demonstrating operational characteristics of the circuit of FIG. 7 according to one embodiment. Hereinafter, with reference to FIGS. 7 to 10, description will be made regarding the operational characteristics of the domain crossing circuit when the initial value S<0:n> of the counter 1100 is set to "100" in order to satisfy latency 2 (2tCK). Accordingly, the counter 1100 counts from "100". Then, even if an abnormal pulse ⓐ occurs in the internal clock signal 'CLK_A' the counter 1100 can respond to the abnormal pulse ⓐ to sequentially perform a next count operation.

In FIG. 10, the first count signal 'CNT_A<0:2>' can be sequentially counted and output. At this time, the least significant bit CNT_A<0> of the first count signal 'CNT_A<0:2>' can be provided as the delayed least significant bit CNT_AD<0> through the replica 1200. Here, the delayed least significant bit CNT_AD<0> can have substantially the same phase as that of the external clock signal 'CLK_C'. The delayed least significant bit CNT_AD<0> can become the least significant bit CNT_B<0> of the second count signal 'CNT_B<0:2>' with substantially the same phase. In addition, the least significant bit CNT_B<0> of the second count signal 'CNT_B<0:2>' can be 2N-divided to provide the most significant bit CNT_B<2> of the second count signal 'CNT_B<0:2>'.

The adder block 1300 can use the least significant bit CNT_A<0> of the first count signal 'CNT_A<0:2>' output in response to the internal clock signal 'CLK_A' to output a bit signal divided in response to the abnormal pulse ⓐ. As described above, in spite of the response of the abnormal pulse ⓐ, the next count operation can be performed in response to a normal clock pulse. Accordingly, even if an abnormal pulse is generated, bit differences between the counter 1100 and the adder block 1300 can occur at a regular clock interval, so that latency can be constantly maintained.

Then, the latch signal 'LATCH' can be generated from the input data signal 'IN', and "011", which is the output bit signal of the second counter 200, can be latched in response to the latch signal 'LATCH'. After the latched "011" is stored as the latch count signal 'LATCH_B<0:n-1>', the latch count signal 'LATCH_B<0:n-1>' and the output bit signal of the first counter 100 can be compared with each other until the output bit signal of the first counter 100 becomes "011". For example, when it is determined by the comparator 700 that the output bit signal of the first counter 100 is substantially equal to the latch count signal 'LATCH_B<0:n>', i.e., after 2tCK(B) has lapsed from the input of the input data signal 'IN', the output data signal 'OUT' can be output so that desired latency can be satisfied.

As described above, when output data is provided by domain-crossing data synchronized with an external clock signal, constant latency can be maintained even if an internal clock signal is instantaneously changed and the output data may correspond to the input data. For example, when a predetermined counter is additionally provided to simultaneously reflect variation occurring in the first counter, or the output signal of the first counter is used, differences between clock intervals are constantly made to satisfy a latency condition even though the internal clock signal is changed.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that flow when taken in conjunction with the above description and accompanying drawings.

What is claimed is:

1. A domain crossing circuit of a semiconductor memory apparatus, the domain crossing circuit comprising:
    a comparative signal providing unit which provides first and second count signals by receiving an internal clock to sequentially count from different initial values; and
    a data processing unit configured to provide output data corresponding to input data based on the second count signal in response to the input data synchronized to an external clock signal;
    wherein the first and second count signals are generated at a same clock period, and represent predetermined clock difference with reference to the internal clock with respect to same bit combination data.

2. The domain crossing circuit of claim 1, wherein a timing, at which the output data is provided, is determined based on the predetermined clock differences between the first and second count signals.

3. The domain crossing circuit of claim 1, further comprising a replica block configured to delay the second count signal by predetermined time such that the second count signal has a phase substantially identical to a phase of the external clock signal.

4. The domain crossing circuit of claim 3, wherein the replica block includes replicas corresponding to output bits of the second count signal.

5. The domain crossing circuit of claim 1, wherein the comparative signal providing unit includes the first and second counters configured to provide the first and second count signals, respectively.

6. The domain crossing circuit of claim 1, wherein the data processing unit includes:
    an input signal receiving unit configured to provide a latch signal by synchronizing the input data to a rising edge of the external clock signal;
    a latch unit configured to latch a signal delayed from the second count signal in response to the latch signal; and a comparator configured to provide the output data corresponding to the input data when an output signal of the latch unit is substantially identical to the first count signal.

7. The domain crossing circuit of claim 6, wherein the input signal receiving unit includes a D flip-flip.

8. The domain crossing circuit of claim 6, wherein the latch unit includes a D flip-flop, and is configured to provide a latch count signal by triggering the signal delayed from the second count signal at a rising edge of the latch signal.

9. The domain crossing circuit of claim 6, wherein the comparator is configured to compare the output signal of the latch unit with the first count signal for duration in which a comparative enable signal is activated, and provide the output data if the output signal of a controller is substantially identical to the first count signal.

10. The domain crossing circuit of claim 9, further comprising a comparative enable signal generating unit configured to provide the comparative enable signal, and which is activated in response to the latch signal and deactivated in response to the output data, by using the output data and the latch signal activated in response to the input signal.

11. A domain crossing circuit of a semiconductor memory apparatus, the domain crossing circuit comprising:
a first counter which receives an internal clock to provide a first count signal by counting from a first initial value;
a target counter block which receives the internal clock to provide a second count signal by counting from a second initial value;
a controller configured to receive input data synchronized with an external clock signal to latch the second count signal; and
a comparator configured to provide an output data synchronized with the internal clock signal according to a comparison result of an output signal of the controller and the first count signal,
wherein the target counter block includes:
a second counter configured to receive the internal clock signal to provide a temporary count signal by sequentially counting from the second initial value; and
a replica block configured to provide the second count signal having a phase substantially identical to a phase of the external clock signal by delaying the temporary count signal by predetermined time.

12. The domain crossing circuit of claim 11 wherein the first counter and the target counter block perform a count operation while representing predetermined clock differences with reference to the internal clock signal with respect to same bit combination data.

13. The domain crossing circuit of claim 11, wherein the replica block includes a plurality of replica blocks, each corresponding to output bits of the second counter.

14. The domain crossing circuit of claim 11, wherein the controller includes:
an input signal receiving unit configured to provide a latch signal by synchronizing the input data to a rising edge of the external clock signal; and
a latch unit configured to latch the second count signal in response to the latch signal.

15. The domain crossing circuit of claim 14, wherein the input signal receiving unit includes a D flip-flop.

16. The domain crossing circuit of claim 14, wherein the latch unit includes a D flip-flop, and is configured to provide a latch count signal by triggering the second count signal at a rising edge of the latch signal.

17. The domain crossing circuit of claim 11, wherein the comparison unit is configured to provide the output data if a comparison enable signal is activated and the output signal of the controller is substantially identical to the first count signal.

18. A domain crossing circuit of a semiconductor memory apparatus, the domain crossing circuit comprising:
a comparative signal providing unit configured to provide first and second count signals by using an output signal of a counter driven by receiving an internal clock signal; and
a data processing unit configured to receive input data synchronized to an external clock signal to compare the first count signal with the second count signal and provide output data at timing when the first count signal is substantially identical to the second count signal, wherein the second count signal is provided by performing an addition operation using a least significant bit of the first count signal.

19. The domain crossing circuit of claim 18, wherein the first and second count signals are generated with substantially a same clock period, and represent predetermined clock differences with reference to the internal clock signal with respect to same bit combination data.

20. The domain crossing circuit of claim 18, wherein timing, in which the first count signal is substantially identical to the second count signal, is determined based on predetermined clock differences between the first count signal and an output signal of the second count signal.

21. The domain crossing circuit of claim 18, wherein the comparative signal providing unit includes:
a counter configured to receive the internal clock signal to provide the first count signal by sequentially counting from an initial value; and
an adder block configured to provide the second count signal by performing the addition operation using the least significant bit of the first count signal.

22. The domain crossing circuit of claim 21, wherein the adder block includes:
a first divider configured to perform 2N-division with respect to the least significant bit of the first count signal; and
a second divider configured to perform 2N-division with respect to an output bit of the first divider.

23. The domain crossing circuit of claim 21, wherein the comparative signal providing unit further includes a replica configured to delay the least significant bit of the first count signal by predetermined time to provide the least significant bit to the adder block so that the least significant bit has substantially a phase identical to a phase of the external clock signal.

24. The domain crossing circuit of claim 18, wherein the data processing unit includes:
an input signal receiving unit configured to provide a latch signal by synchronizing the input data to a rising edge of the external clock;
a latch unit configured to latch an output signal of the second count signal in response to the latch signal; and
a comparator configured to provide the output data corresponding to the input data according to a comparison result of the second count signal and the first count signal.

25. The domain crossing circuit of claim 24, wherein the input signal receiving unit includes a D flip-flop.

26. The domain crossing circuit of claim 24, wherein the latch unit includes a D flip-flop, and is configured to provide a latch count signal by triggering the second count signal at a rising edge of the latch signal.

27. A domain crossing circuit of a semiconductor memory apparatus, the domain crossing circuit comprising:
- a comparative signal providing unit configured to provide a first count signal and a second count signal in response to an internal clock signal, the first count signal being a source signal for an internal clock signal domain, the second count signal being a target signal for the internal clock domain and provided by performing an addition operation using a least significant bit of the first count signal; and
- a data processing unit configured to provide output data obtained by converting input data for an external clock domain received based on an external clock signal into a signal for the internal clock domain by using the first and second count signals, wherein the output data are output based on output timing of the second count signal.

28. The domain crossing circuit of claim 27, wherein the first and second count signals are generated with substantially a same clock period, and represent predetermined clock differences with reference to the internal clock signal with respect to same bit combination data.

29. The domain crossing circuit of claim 28, wherein output timing of the output data is timing in which the first count signal is substantially identical to the second count signal.

30. The domain crossing circuit of claim 27, wherein the comparative signal providing unit includes:
- a counter configured to receive the internal clock to provide the first count signal by sequentially counting from an initial value; and
- an adder block configured to provide the second count signal by performing an addition operation using the least significant bit of the first count signal.

31. The domain crossing circuit of claim 30, wherein the adder block includes:
- a first divider perform 2N-division with respect to the least significant bit of the first count signal; and
- a second divider configured to perform 2N-division with respect to an output bit of the first divider.

32. The domain crossing circuit of claim 30, wherein the comparative signal providing unit further includes a replica configured to delay the least significant bit of the first count signal by predetermined time to provide the least significant bit to the adder block so that the least significant bit has a phase substantially identical to a phase of the external clock signal.

33. The domain crossing circuit of claim 27, wherein the data processing unit includes:
- an input signal receiving unit configured to provide a latch signal by synchronizing the input data to a rising edge of the external clock signal;
- a latch unit configured to latch an output signal of the second count signal in response to the latch signal; and
- a comparator configured to provide the output data corresponding to the input data according to a comparison result of the second count signal and he first count signal.

34. The domain crossing circuit of claim 33, wherein the input signal receiving unit includes a D flip-flop.

35. The domain crossing circuit of claim 33, wherein the latch unit includes a D flip-flop, and provides a latch count signal by triggering the second count signal at a rising edge of the latch signal.

36. The domain crossing circuit of claim 35, wherein the comparator determines if the latch count signal is substantially identical to the first count signal.

* * * * *